(12) United States Patent
Cheema et al.

(10) Patent No.: US 7,196,594 B2
(45) Date of Patent: Mar. 27, 2007

(54) SURFACE ACOUSTIC WAVE DUPLEXER HAVING ENHANCED ISOLATION PERFORMANCE

(75) Inventors: Kamran S. Cheema, Apopka, FL (US); Mei Yuin Foo, Longwood, FL (US); Aytac Aydin, Bourron Marlotte (FR)

(73) Assignee: Triquint, Inc., Orlando, FL (US)

( * ) Notice: Subject to any disclaimer, the term of this patent is extended or adjusted under 35 U.S.C. 154(b) by 168 days.

(21) Appl. No.: 11/046,212

(22) Filed: Jan. 28, 2005

(65) Prior Publication Data

US 2005/0206477 A1   Sep. 22, 2005

Related U.S. Application Data

(60) Provisional application No. 60/539,946, filed on Jan. 29, 2004.

(51) Int. Cl.
    H03H 9/72   (2006.01)
(52) U.S. Cl. .................................... 333/133; 333/195
(58) Field of Classification Search ................. 333/133
    See application file for complete search history.

(56) References Cited

U.S. PATENT DOCUMENTS

| | | | |
|---|---|---|---|
| 5,689,502 A | 11/1997 | Scott | |
| 5,745,484 A | 4/1998 | Scott | |
| 5,802,046 A | 9/1998 | Scott | |
| 5,832,389 A | 11/1998 | Dent | |
| 5,859,473 A | 1/1999 | Ikata et al. | |
| 5,864,260 A * | 1/1999 | Lee | 333/133 |
| 5,959,980 A | 9/1999 | Scott | |
| 6,049,538 A | 4/2000 | Scott | |
| 6,094,421 A | 7/2000 | Scott | |
| 6,108,364 A | 8/2000 | Weaver, Jr. et al. | |
| 6,125,109 A | 9/2000 | Fuerter | |
| 6,141,373 A | 10/2000 | Scott | |
| 6,154,486 A | 11/2000 | Scott et al. | |
| 6,188,877 B1 | 2/2001 | Boesch et al. | |
| 6,292,559 B1 | 9/2001 | Gaikwad et al. | |
| 6,297,712 B1 * | 10/2001 | Kadota et al. | 333/133 |
| 6,298,244 B1 | 10/2001 | Boesch et al. | |
| 6,317,495 B1 | 11/2001 | Gaikwad et al. | |
| 6,356,607 B1 | 3/2002 | Scott et al. | |
| 6,363,107 B1 | 3/2002 | Scott | |
| 6,366,566 B1 | 4/2002 | Scott | |
| 6,388,997 B1 | 5/2002 | Scott | |
| 6,445,261 B1 * | 9/2002 | Yuda et al. | 333/133 |
| 6,466,103 B2 | 10/2002 | Iwamoto et al. | |
| 6,513,163 B1 | 1/2003 | Silvia et al. | |
| 6,566,981 B2 * | 5/2003 | Urabe et al. | 333/193 |
| 6,640,111 B1 | 10/2003 | Shapira | |
| 6,684,058 B1 | 1/2004 | Karacaoglu et al. | |
| 6,751,470 B1 | 6/2004 | Ellä et al. | |
| 6,839,429 B1 | 1/2005 | Gaikwad et al. | |

(Continued)

FOREIGN PATENT DOCUMENTS

JP   2003-298462   * 10/2003

*Primary Examiner*—Barbara Summons
(74) *Attorney, Agent, or Firm*—Allen, Dyer, Doppelt, Milbrath & Gilchrist, P.A.

(57) ABSTRACT

A miniaturized SAW duplexer includes SAW filters carried on a monolithic piezoelectric chip that is mounted inside a multi-layered ceramic package. A phase matching stripline is embedded diagonally and between two ground layers of the multi-layered ceramic package and is positioned between a wall of vias for significantly minimizing coupling between transmitted and received filters by providing an improved ground shielding of the phase matching stripline. Coupling within the same filter and coupling between the SAW filters are suppressed and thus provide enhanced isolation performance. for the SAW duplexer.

10 Claims, 14 Drawing Sheets

U.S. PATENT DOCUMENTS

| | | |
|---|---|---|
| 6,937,113 B2 * | 8/2005 | Ohashi et al. ............... 333/133 |
| 2002/0032004 A1 | 3/2002 | Widrow |
| 2002/0039885 A1 | 4/2002 | Weissman et al. |
| 2002/0071497 A1 | 6/2002 | Bengtsson et al. |
| 2002/0123365 A1 | 9/2002 | Thorson et al. |
| 2003/0021367 A1 | 1/2003 | Smith |
| 2003/0109241 A1 | 6/2003 | Kim |
| 2003/0123401 A1 | 7/2003 | Dean |
| 2003/0153348 A1 | 8/2003 | Lahlum et al. |
| 2003/0157907 A1 | 8/2003 | Leinonen et al. |
| 2003/0174763 A1 | 9/2003 | Kouki |
| 2003/0203717 A1 | 10/2003 | Chuprun et al. |
| 2003/0214369 A1 | 11/2003 | Kearns et al. |
| 2004/0095907 A1 | 5/2004 | Agee et al. |
| 2004/0212451 A1 | 10/2004 | Iwamoto et al. |

* cited by examiner

SURFACE ACOUSTIC WAVE DUPLEXER HAVING ENHANCED ISOLATION PERFORMANCE

CROSS-REFERENCE TO RELATED APPLICATION

This application claims the benefit of U.S. Provisional Application No. 60/539,946 having filing date Jan. 29, 2004 for SAW Duplexer With Enhanced Isolation Performance, the disclosure of which is hereby incorporated by reference in its entirety, all being commonly owned.

FIELD OF INVENTION

The present invention generally relates to surface acoustic wave (SAW) devices, and more particularly to a SAW duplexer.

BACKGROUND

Figure 1:
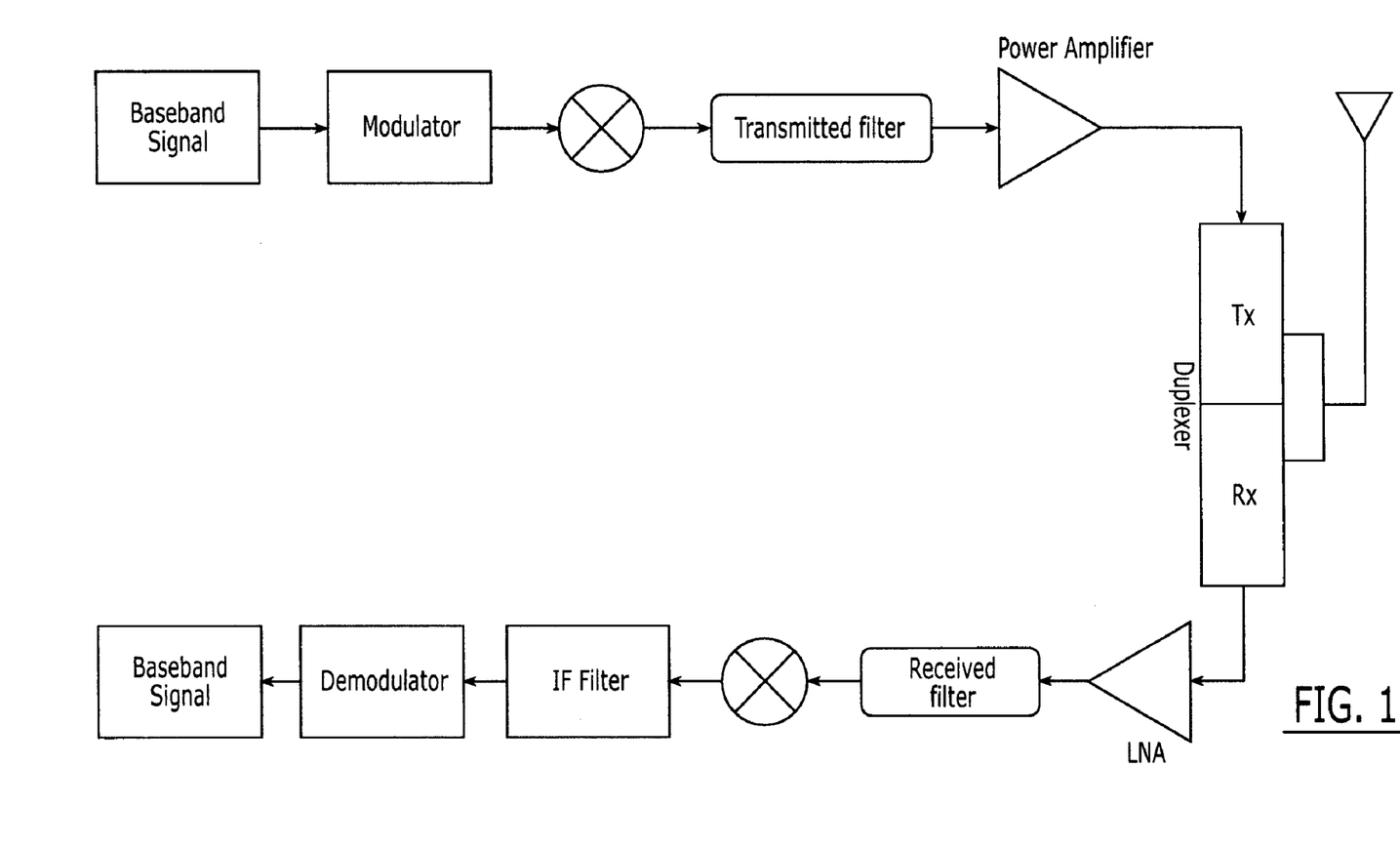
FIG. 1 is a functional block diagram illustrating elements of a typical CDMA cellular transceiver.

A duplexer is generally known to be used to appropriately select a desired frequency band of transmitted and received signals in a communication radio. By way of example, and with reference to FIG. 1, a typical architecture for a code division multiple access (CDMA) cellular transceiver for operation in a cellular frequency band is illustrated. A modulated baseband signal is filtered, up-converted and amplified to a desired signal intensity before being fed to the duplexer. The duplexer selects a signal within a desired signal band and then transmits the signal through an antenna as a modulated carrier signal. Conversely, a received signal, appropriately selected by the duplexer, is amplified, filtered and eventually demodulated at the baseband.

A SAW duplexer may perform the selection of the desired signal band through a frequency filtering process comprising two SAW filters operating at different frequency bands. By way of example, the duplexer may have a received filter covering a passband from 869 MHz to 894 MHz and a transmitted filter covering a passband from 824 MHz to 849 MHz for a Cellular CDMA radio. For the personal communication services (PCS) CDMA radio, the received filter is generally set to cover the band from 1930 MHz to 1990 MHz while the transmitted filter covers the band from 1850 MHz to 1910 MHz. Thus, the SAW duplexer typically enables the simultaneous receipt and transmittance of the communication signals. In addition to providing the filtering selection of the appropriate signal band, the duplexer must also provide a desirable isolation between the received and transmitted channels. The received filter allows the receipt of the incoming signal and at the same time it must block any interference from the transmitted signal. Similarly, the transmitted filter allows the signal to be transmitted and simultaneously must block the interference from the received signal. Isolation is a measure of a desirable performance requirement in a duplexer. This is particularly the case for the CDMA mobile phone transceiver. In this type of transceiver, the incoming signal may be very weak, while the transmitted signal is generally very strong typically, 26–30 dB. Any leakage of the transmitted signal to a received channel could easily over-load the low noise amplifier. Therefore, a phase matching network is commonly used in SAW duplexers to provide isolation between the transmitted and received bands. While the transmitted and received filters of the duplexer are designed to be around 50 ohms, the phase matching network provides an impedance transformation at the outer band of the filter, and without a significant impact on the degradation of the passband characteristics. For example, while the impedance of the received filter is matched to be approximately 50 ohms across the passband, the impedance of the received filter should be very large at the transmitted frequency band. A microstrip line is generally embedded into the SAW duplexer package to perform the impedance transformation through phase shifting. To transform such a large swing of impedance, it is not uncommon to find devices with a strip length in the order of a quarter wavelength. The microstrip is generally embedded along the boundary edge of the package so as not to interfere with the SAW duplexer performance.

By way of example, U.S. Pat. No. 5,859,473 to Ikata et al. discloses two SAW filter die assembled in separated chambers of a multi-layered ceramic package. The separated filter die has the advantage that it minimizes any coupling between the transmitted and received filters. However, as the demand for miniaturization of SAW duplexers is enhanced, there is a need to have the two SAW filters incorporated into a single monolithic chip. Maintaining sufficient isolation between the two SAW filters is then complicated by a single chip implementation of the SAW duplexer. U.S. Pat. No. 6,466,103 to Iwamoto et al. discloses a SAW duplexer with a monolithic chip with a dimension of about 5 mm (width)×5 mm (length)×1.5 mm (height) and an arrangement of the phase matching line pattern at a position that is connected to bonding pads that are situated at a maximum distance from each other to reduce the interference between the two filters coupled through the matching line pattern.

To meet the demand for further size reduction of the SAW duplexer to a dimension of 3.8 mm (width)×3.8 mm (length) and 1.5 mm (height), as the SAW filters are laid closer together, the problems associated with maintaining an adequate isolation become even more complex. With less room to implement a phase matching line pattern that has to be approximately a quarter wavelength in length, it is more difficult to minimize the coupling between the filters through the line pattern. Furthermore, with the further shrinkage in the die size, second order effects have been discovered which degrade the isolation in both the transmitted and received bands of the duplexer.

Figure 2:
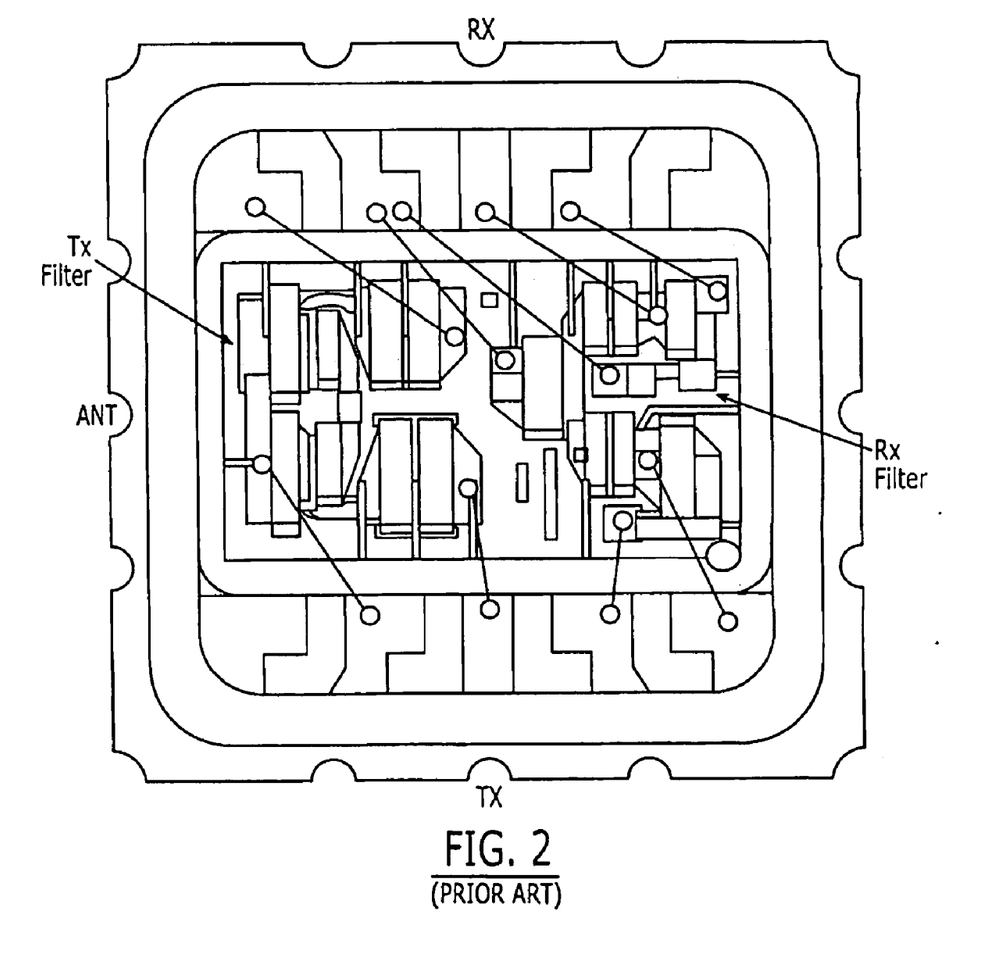
FIG. 2 is a partial diagrammatical plan view of a CDMA cellular SAW duplexer chip illustrating known transmitted and received filter patterns.
Figure 3:
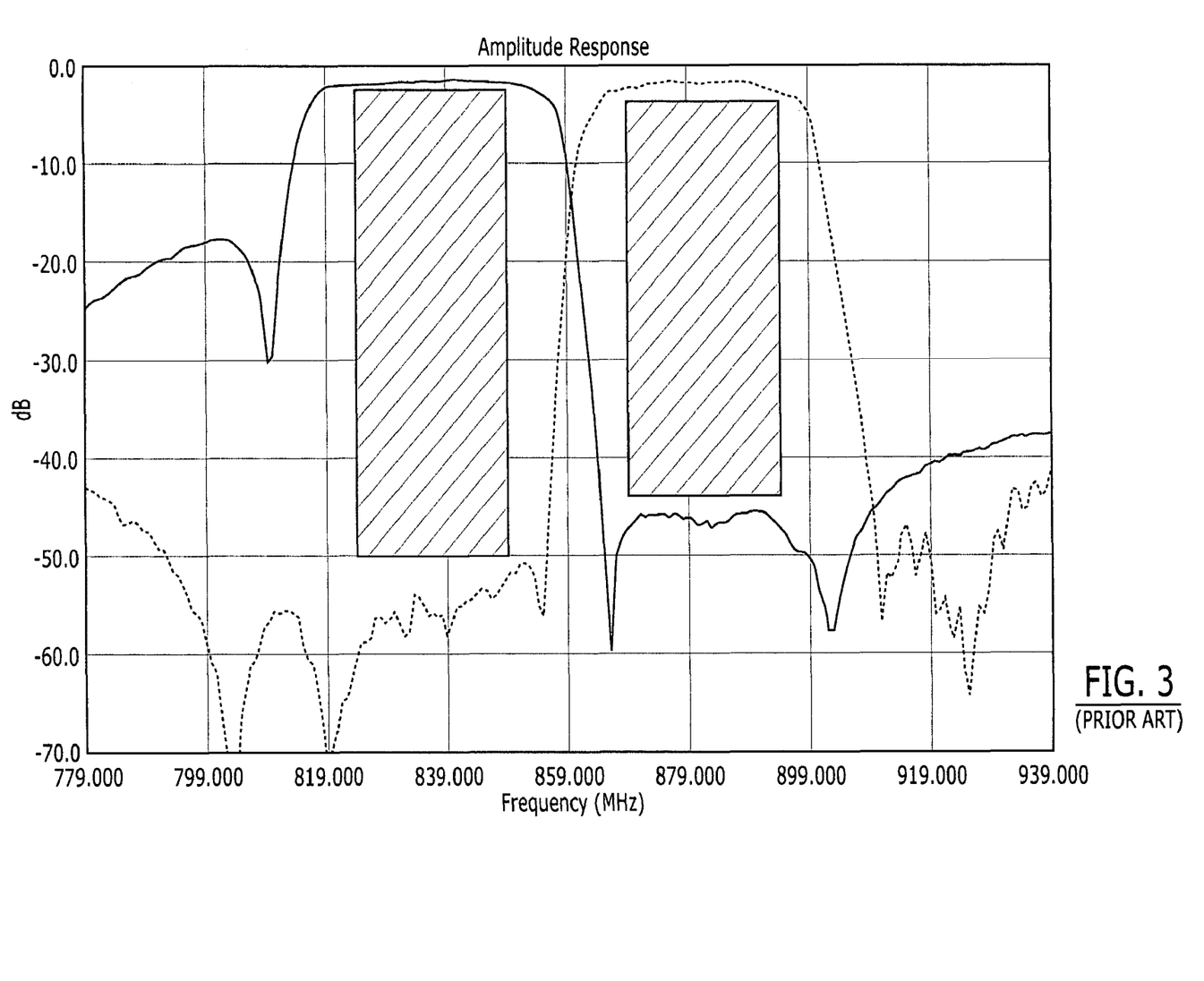
FIG. 3 illustrates a frequency response for the duplexer of FIG. 2.
Figure 4:
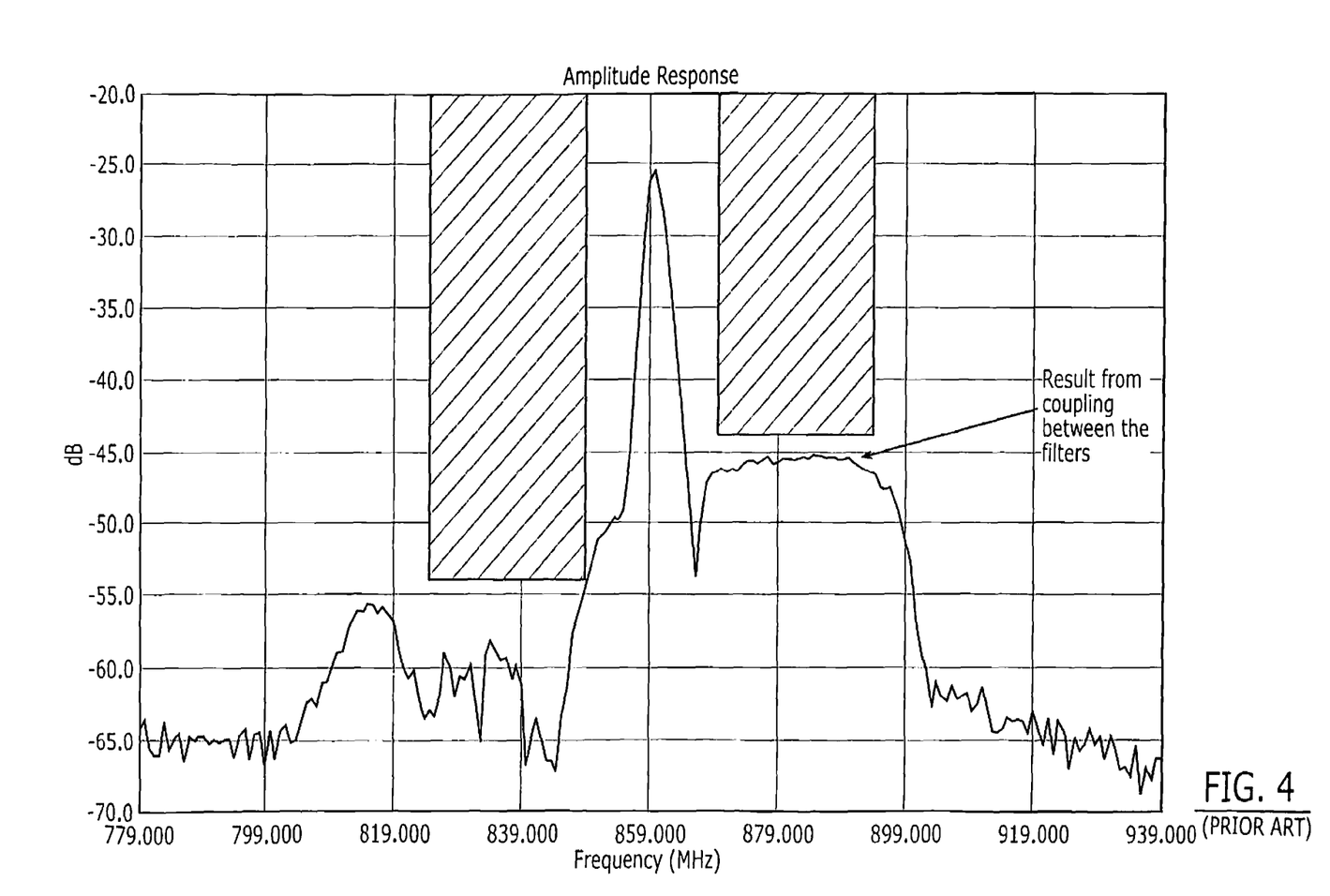
FIG. 4 is an isolation plot for a duplexer illustrating a degraded performance at a received band.

By way of further example and as illustrated with reference to FIG. 2, a CDMA Cellular SAW duplexer chip mounted in a multi-layered ceramic package is presented. The SAW duplexer includes a received filter which covers the frequency band of 869 MHz to 894 MHz and a transmitted filter covering the passband of 824 MHz to 849 MHz. A phase matching network is embedded between the multi-layered package. FIGS. 3 and 4 illustrate frequency responses and isolation performance of the SAW duplexer of FIG. 2. As can be seen, the isolation performance immediately beneath the receiver band is only slightly over 45 dB. The degraded Rx isolation results from capacitive and inductive coupling between the transmitted filter and the received filter, as well as coupling within the transmitted filter and received filter.

SUMMARY

One embodiment of the invention is herein described as a miniaturized SAW duplexer including two SAW filters carried on a monolithic piezoelectric chip, which chip is mounted inside a multi-layered ceramic package. A phase matching stripline may be embedded diagonally and between two ground layers of the multi-layered ceramic package, and is surrounded by a wall of via holes for significantly minimizing coupling between the transmit and receive filters by providing an improved ground shielding of the phase matching stripline. Further, teachings of the invention provide a miniaturized SAW duplexer that suppresses coupling within the same filter and coupling between the two SAW filters, thus providing an enhanced isolation performance.

BRIEF DESCRIPTION OF DRAWINGS

Embodiments of the invention are described, by way of example, with reference to the accompanying drawings in which.

DETAILED DESCRIPTION OF EMBODIMENTS

The present invention will now be described more fully hereinafter with reference to the accompanying drawings, in which embodiments of the invention are shown. However, this invention may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 5:
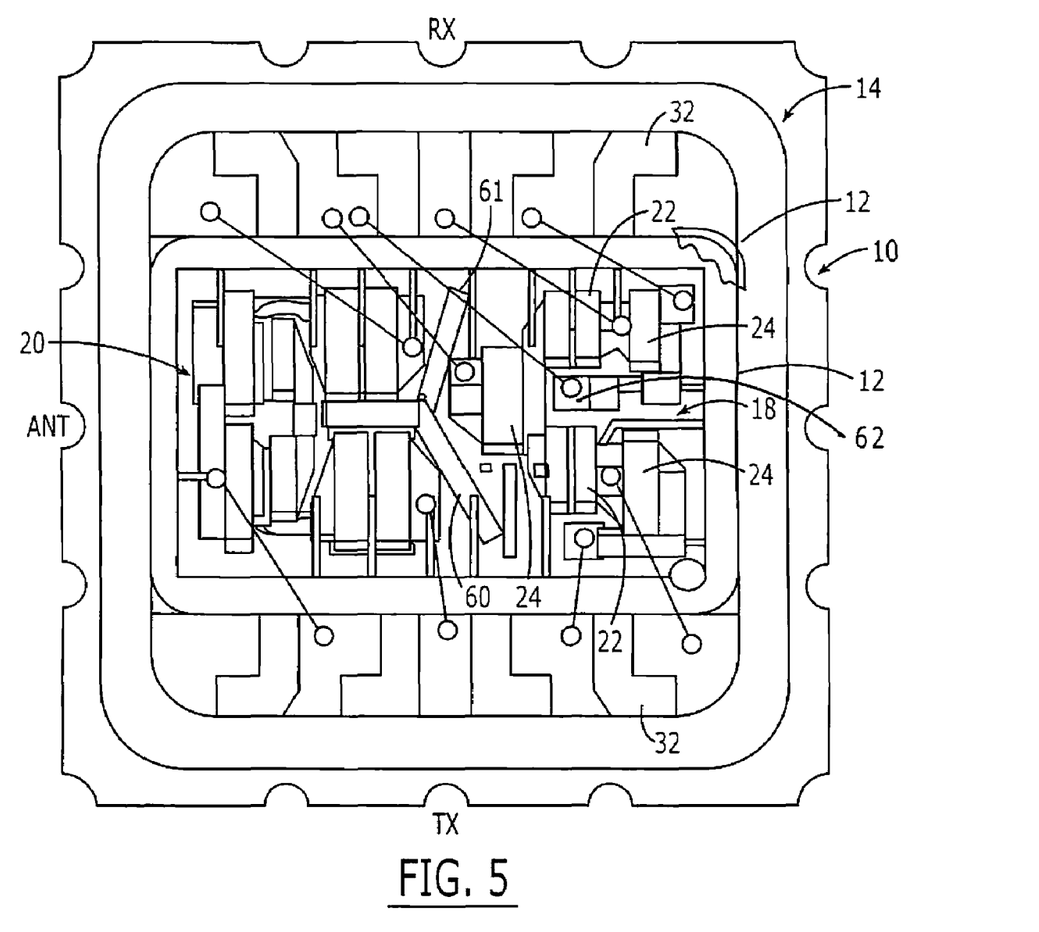
FIG. 5 is a partial diagrammatical plan view illustrating a SAW duplexer in a multilayered ceramic package in keeping with the teachings of the present invention.
Figure 5A:
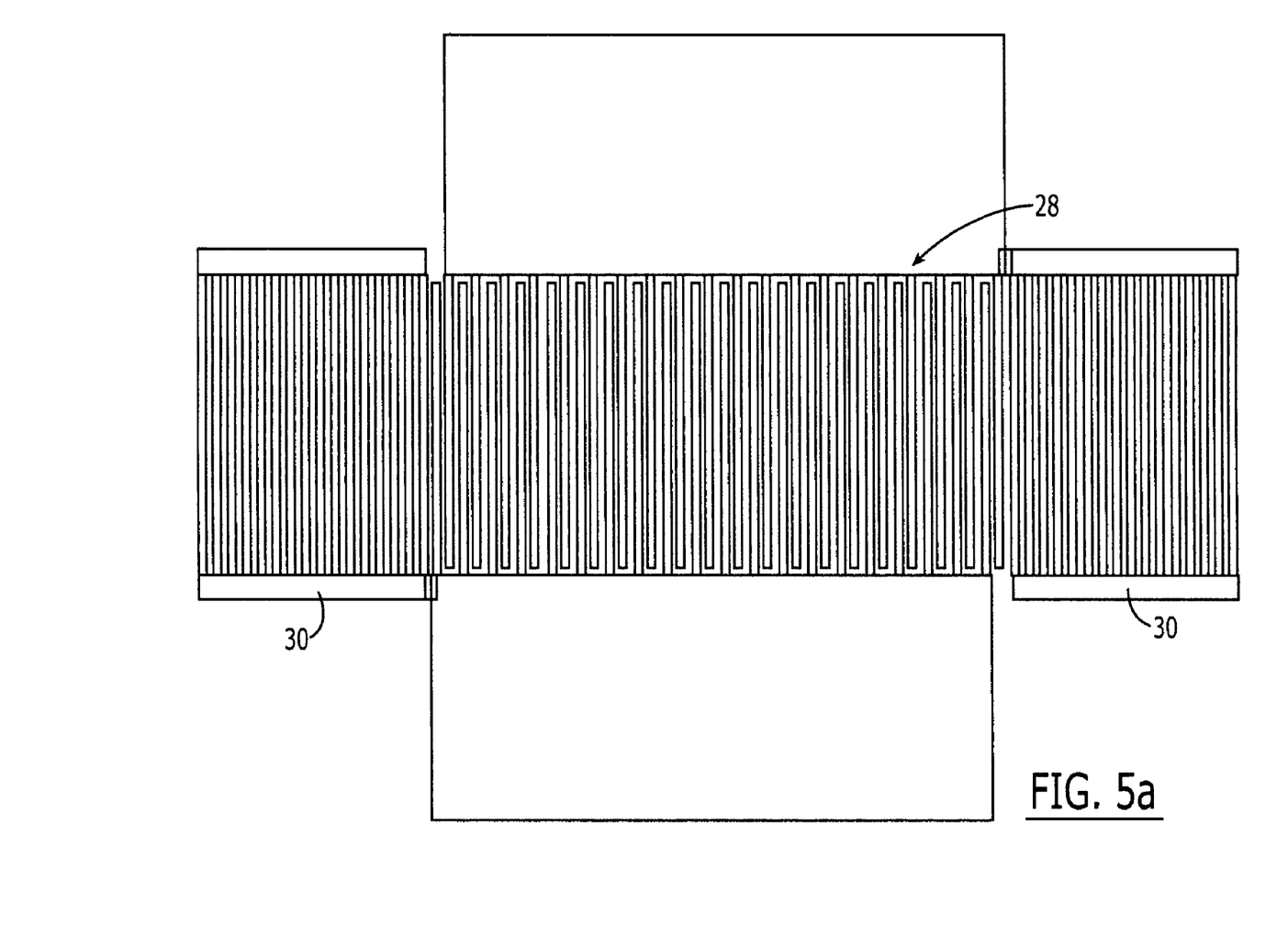
FIG. 5a is a diagrammatical plan view of a SAW transducer embedded between two opposing reflectors.
Figure 6:
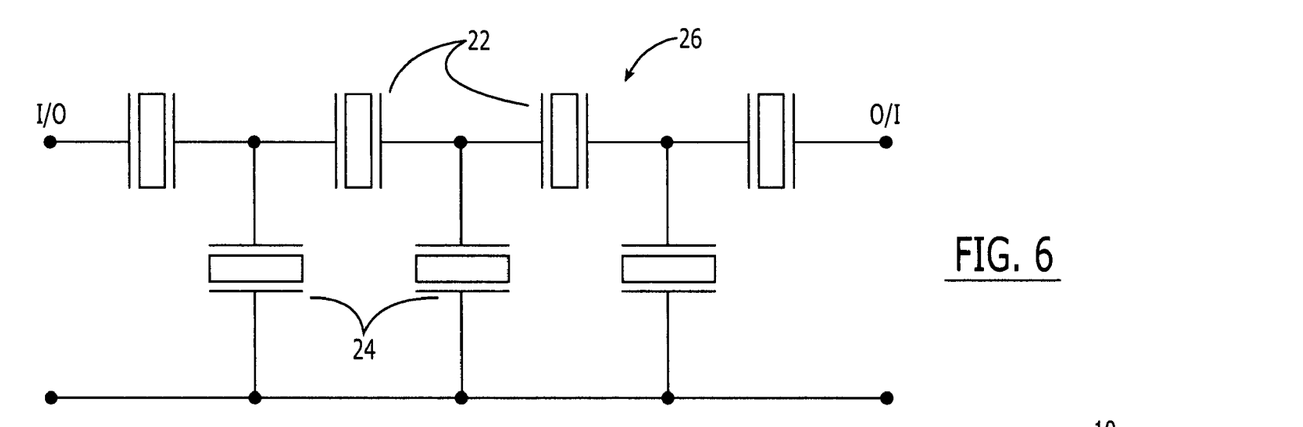
FIG. 6 is a schematic layout illustrating one ladder filter.
Figure 7:
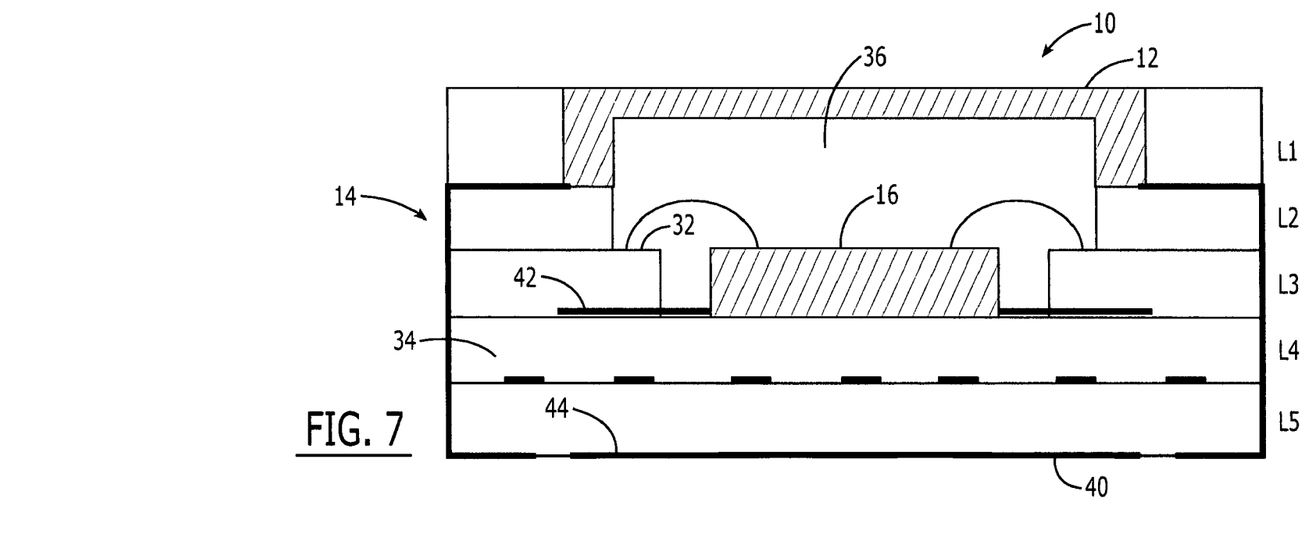
FIG. 7 is a partial cross-sectional elevation view of a SAW duplexer in multilayer ceramic package.

With reference to FIG. 5, one embodiment of the invention may be described as a SAW duplexer 10 as herein with a lid or cover 12 removed from the package 14. The SAW duplexer chip 16, mounted in the multi-layered ceramic package 14 includes a received filter 18 and a transmitted filter 20. The filters 18, 20 are SAW filters including series and parallel resonators 22, 24 arranged in a ladder type structure 26 as illustrated by way of example with reference to FIGS. 5a and 6. Each resonator 22, 24 comprises of the SAW transducer 28 and reflector strips 30. The frequency of operation of the received filter 18 is generally set at a higher frequency than that of the transmitted filter 20. The duplexer chip 16, as herein described by way of example, is fabricated on a single crystal piezoelectric substrate of Lithium Tantalate or Lithium Niobate. The received and transmitted filter pattern comprises a metal, primarily made of Al or Al alloy. Multiple bonding pads 32 are carried on the ceramic package 14 for providing electrical and ground connections for the filters and an antenna. A phase matching stripline 34 is embedded between layers (L1–L5) of the package and is shown schematically in the cross-sectional view of a SAW duplexer package in FIG. 7.

The phase matching stripline 34 provides an impedance transformation through phase shifting between the transmitted and received filters 20, 18 to reduce passband degradation. Thus, the phase matching stripline 34 enables the received filter 18, while operating approximately at about 50 ohms at the received band, to provide a very high impedance at the transmitted band, thereby reducing the interference of the transmitted signal at the received band. The phase matching stripline 34 may be embedded between layers L4 and L5, as illustrated with reference again to FIG. 7. For the embodiment herein described by way of example, a ground pattern is carried on the top of layer L4 upon which the SAW duplexer chip 16 is mounted. Layers L1, L2, and L3 form a cavity 36 within which the SAW duplexer chip 16 is enclosed. The lid/cover 12 is attached on top of layer L2 and is grounded through a side castellation 38 to the bottom 40 of the package 14. The phase matching stripline 34 is sandwiched between two ground planes, first 42 and second 44, that provide shielding to enhance isolation between the transmitted and received filters 20, 22 of the SAW duplexer chip 16.

Figure 8:
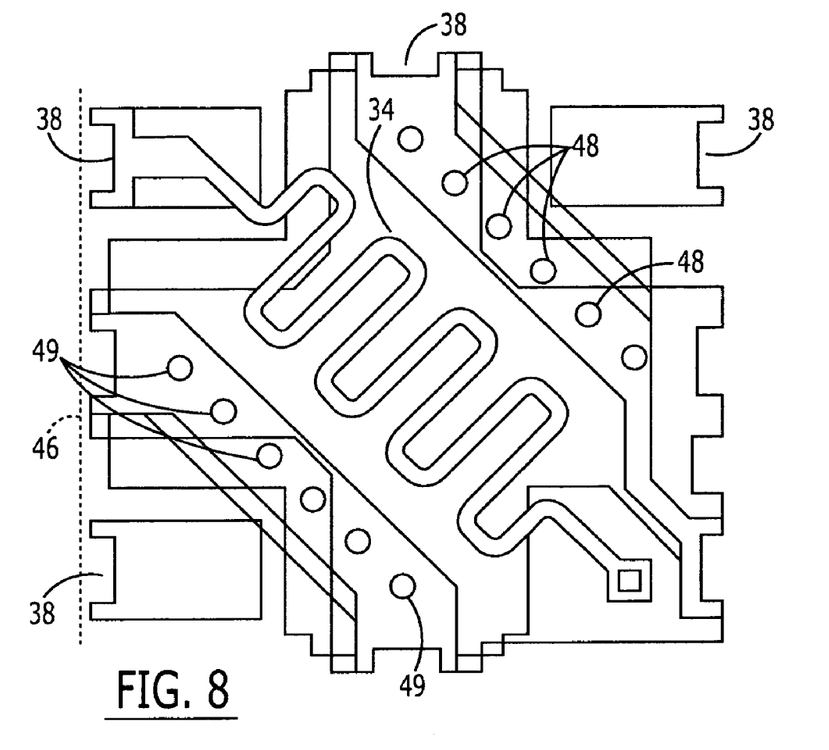
FIG. 8 is a partial plan view illustrating duplexer phase matching stripline positioned between two walls of via holes.
Figure 9:
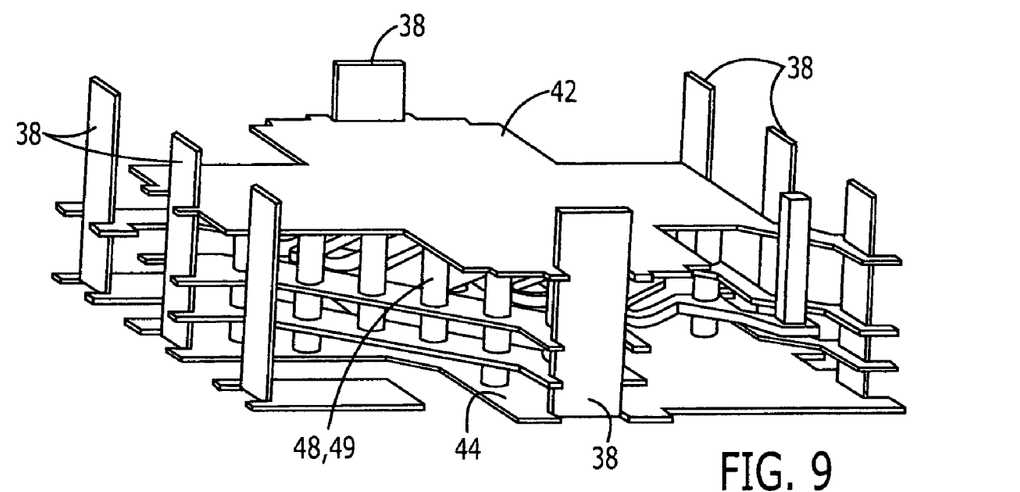
FIG. 9 is a partial perspective view illustrating the duplexer of FIG. 8, wherein the phase matching stripline is embedded between two ground plane and between the walls of via holes for optimizing shielding.

With reference now to FIGS. 8 and 9, illustrating plan and perspective views, respectively, of one embodiment of the phase matching stripline 34, a layer embedded between the two ground planes 42, 44. As earlier described with reference to known practices in the art, it is common practice to have traces such as phase matching striplines along the outer edges of a SAW package to reduce interference between the SAW filters. It is commonly perceived that running the phase matching stripline along the outer edge of the package would yield a maximum isolation as the stripline is not directly underneath the filter pattern. However, through experimentation, unexpectedly better isolation is obtained with the phase matching stripline 34, as herein described by way of example, extending generally diagonally making an angle of approximately 45° with respect to an edge line 46 of the package and positioned between two rows of via holes or vias 48 as herein illustrated. The stripline may be formed at angles for 30 degrees to 60 degrees while keeping within teachings of the present invention. One embodiment may include a meandering serpentine styled stripline, as herein described by way of example, and may have the first ground plane 42 at the top, the second ground plane 44 at the bottom, and two walled of vias 48, 49 on opposing sides of the stripline 34 connecting these ground planes. The meandering phase matching stripline 34 may be composed of tungsten or copper, alloys thereof, and the like. One terminal 50 is connected to a pad 52 of the received filter 18 and the other terminal 54 is connected to the antenna pad 56, or the output pad 58 of the transmitted filter 20.

Figure 10:
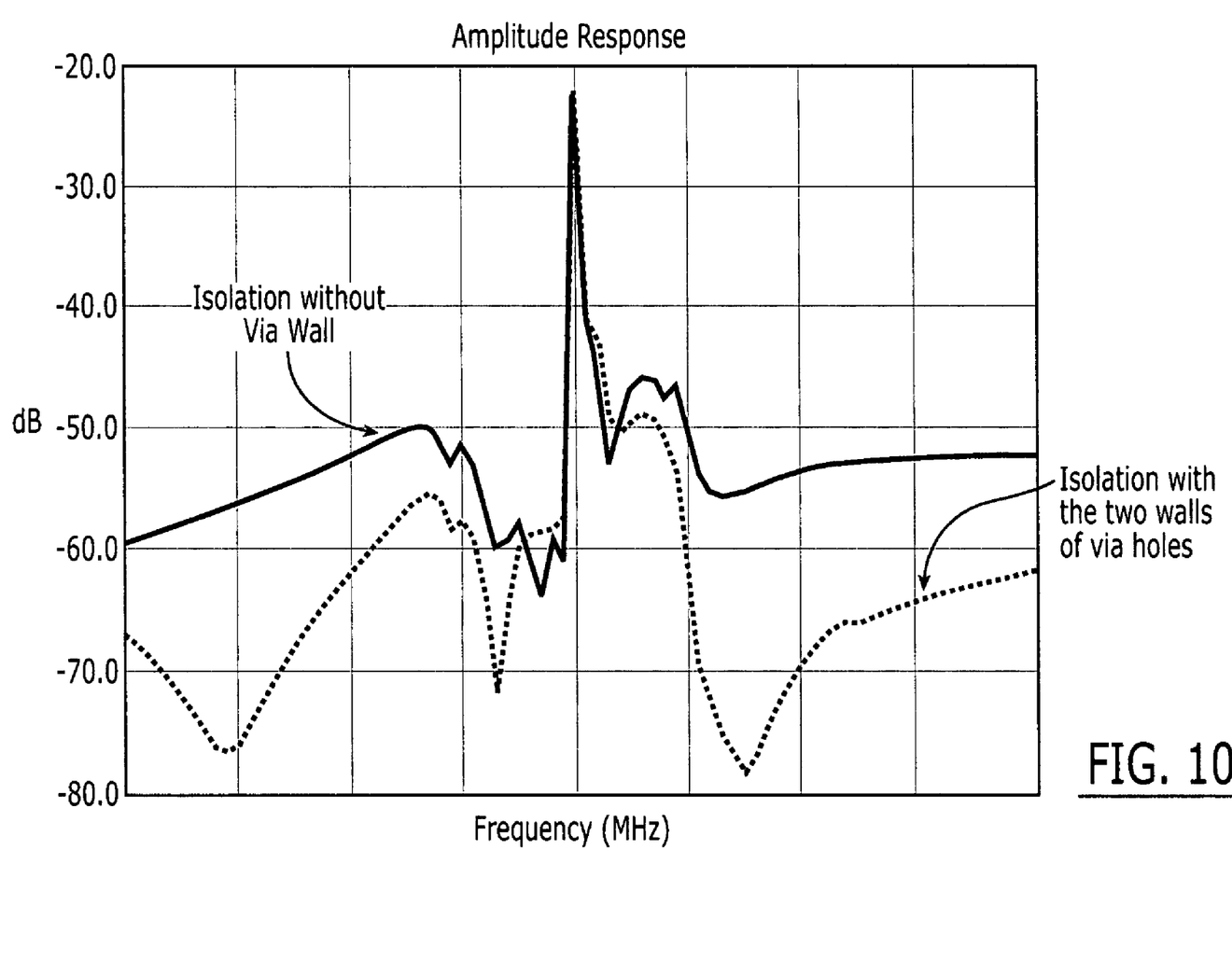
FIG. 10 includes amplitude versus frequency plots illustrating isolation performance of a duplexer with and without use of the walls of via holes above described with reference to FIG. 8.

With reference now to FIG. 10, the isolation performance of SAW duplexers known in the art (without vias 48, 49) and one with the vias are illustrated. As can be clearly seen, the isolation performance for embodiments of the present invention is superior, and certainly more desirable, to that of SAW duplexer known in the art. The ground via walls minimize the ground inductance and provide a surrounded shield which further reduces significantly any coupling between the stripline and the SAW filters.

The vias 48, 49, also referred to as via holes, are generally composed either of tungsten, copper, silver or its alloys. In known SAW duplexer, as traces or striplines commonly meander along the edge, the via holes cannot completely surround the stripline and therefore cannot provide significantly good shielding to radiation thereby providing a coupling path for the filters. The stripline 34 will generally be implemented with a preselected length (approximately ¼ of the wavelength) to provide a desirable phase shift for impedance transformation. The grounded walls of vias 48, 49 enable the phase matching stripline to be implemented in a meandering fashion diagonally along the package and directly underneath the SAW filter pattern allowing for further a desirable shrinkage of the duplexer package size.

Figure 11:
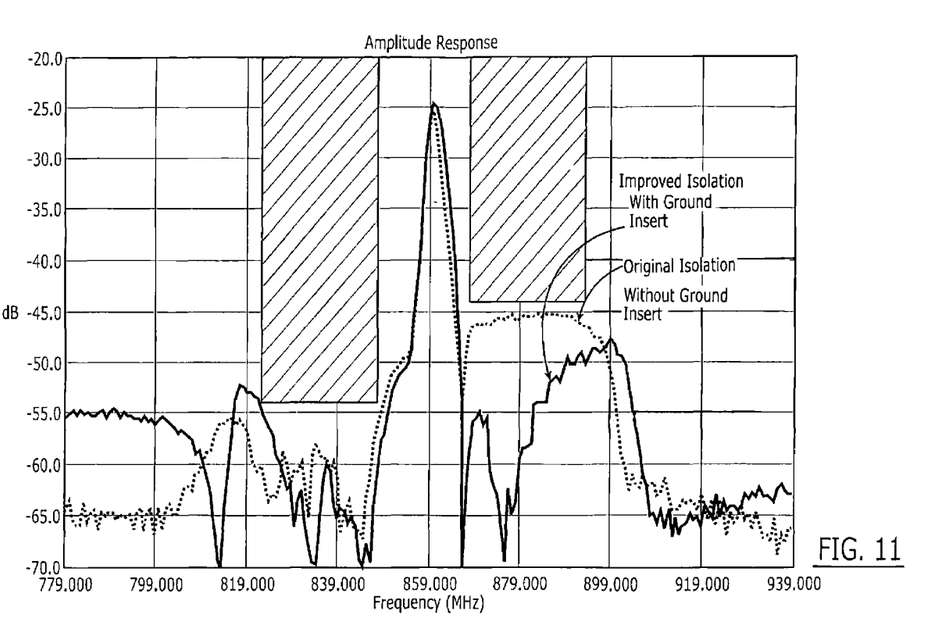
FIG. 11 includes amplitude versus frequency plots illustrating an improved isolation for a SAW duplexer using ground inserts according to the teachings of the present invention.

As the SAW duplexer die size becomes smaller, it becomes easier for energy coupling between the transmitted and received filters. Additionally, there is coupling between the resonators within a filter itself that could degrade isolation performance of the duplexer. With reference again to FIG. 5, two slanted ground lines 60, 61 are inserted between the transmitted filter 20 and the received filter 18 In addition, a ground strip or pattern 62 is also inserted between the input and output resonators 22 of the transmitted filter 20 to reduce coupling. The ground pattern provides a shield and suppresses the capacitive coupling between the transmitted filter and the received filter. By way of example, FIG. 11 illustrates a distinctly improved isolation between a duplexer with the ground insert as compared to that without the ground insert between the two filters.

Figure 12:
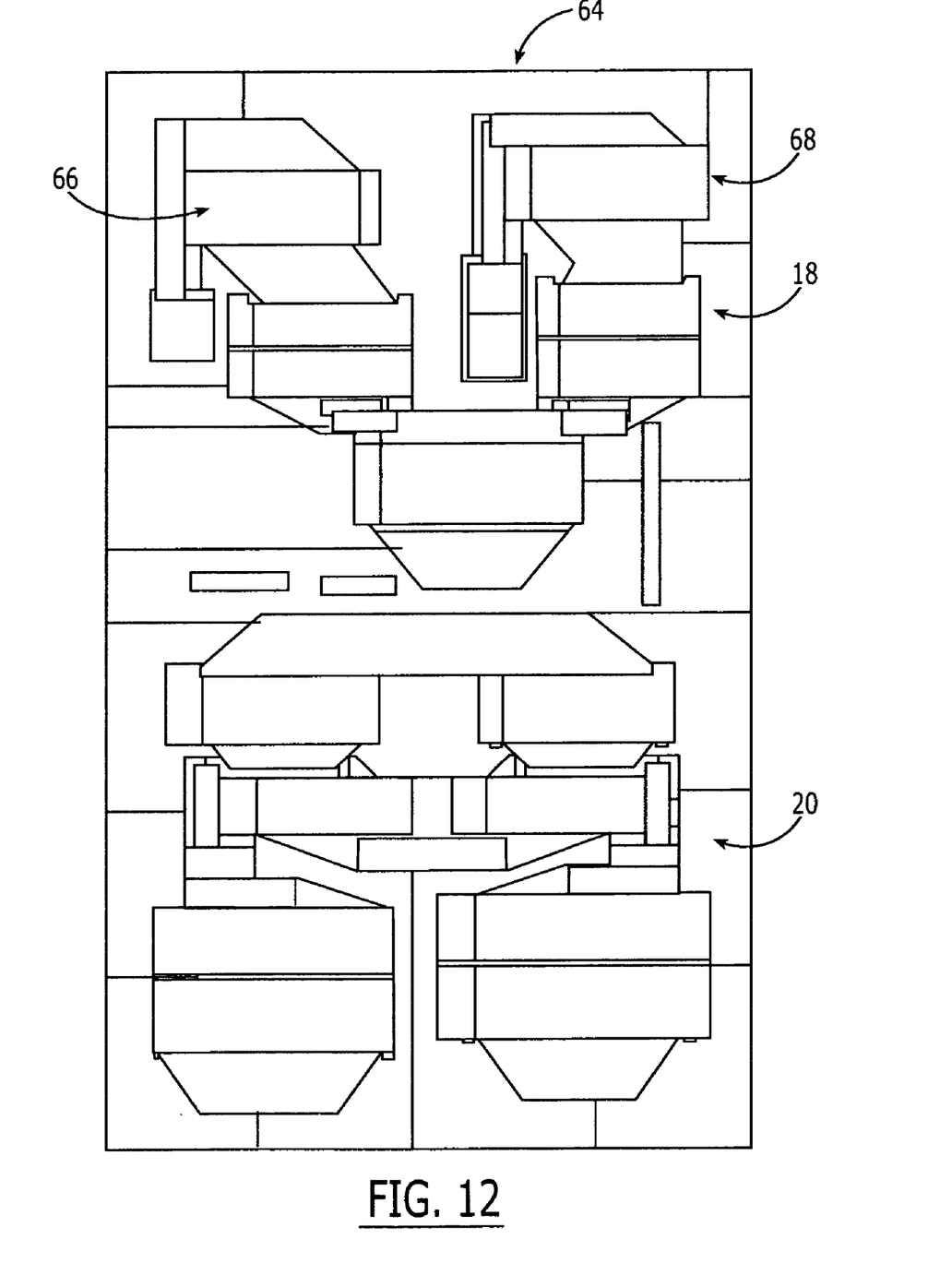
FIG. 12 is a diagrammatical plan view illustrating one SAW duplexer without ground inserts between first and second resonators.
Figure 13:
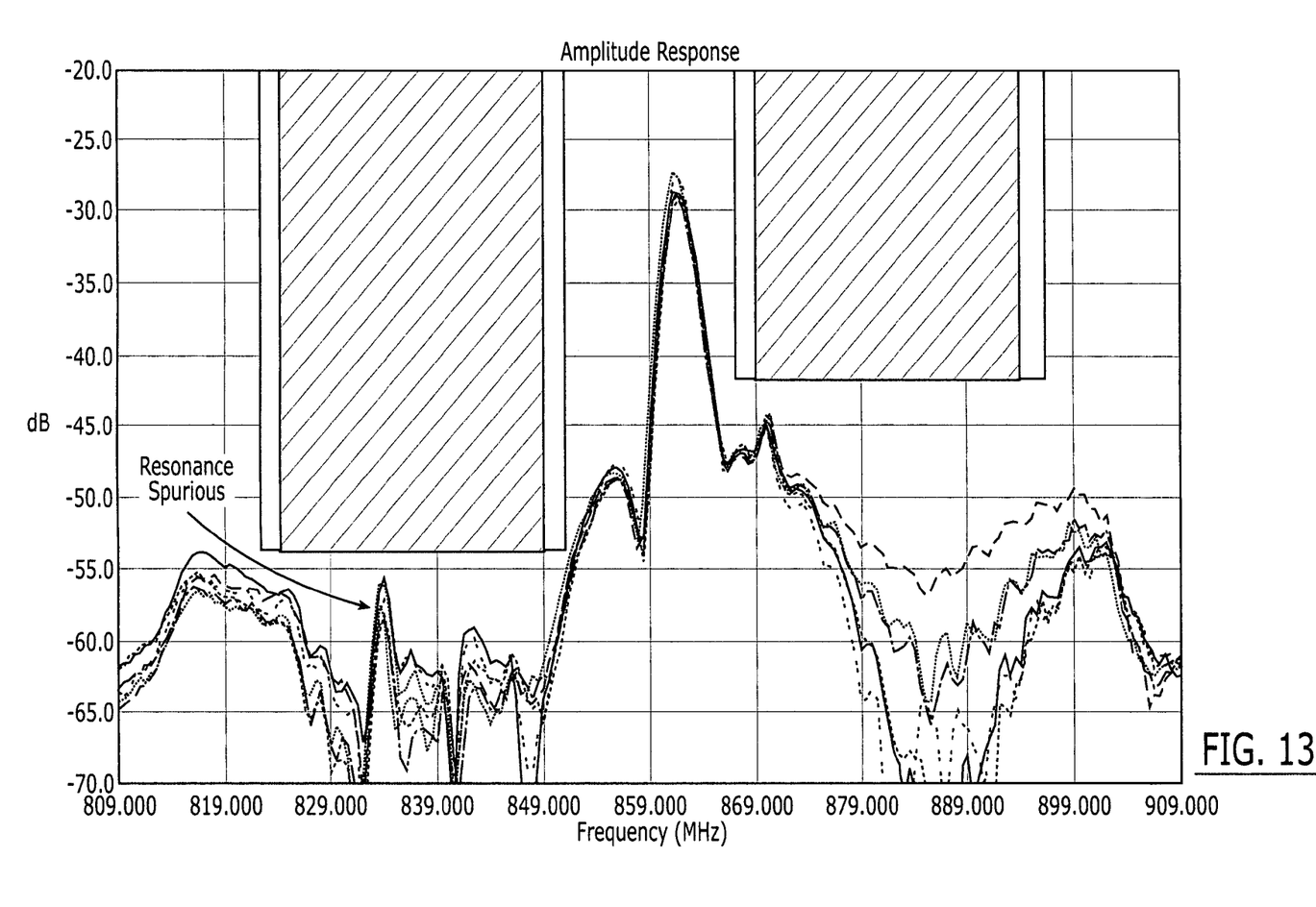
FIG. 13 illustrates a frequency response as a result of a coupling between the first and second resonators of FIG. 12.
Figure 14A:
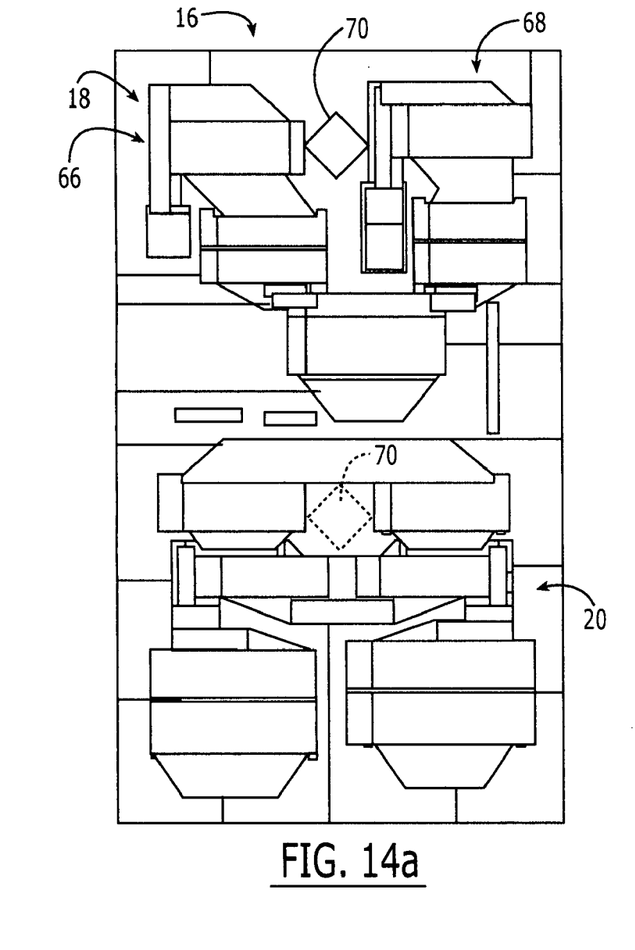
FIGS. 14a and 14b are diagrammatical plan views illustrating one use of metal wedges shaped as a diamond or triangle, respectively, inserted between the coupling resonators.
Figure 14B:
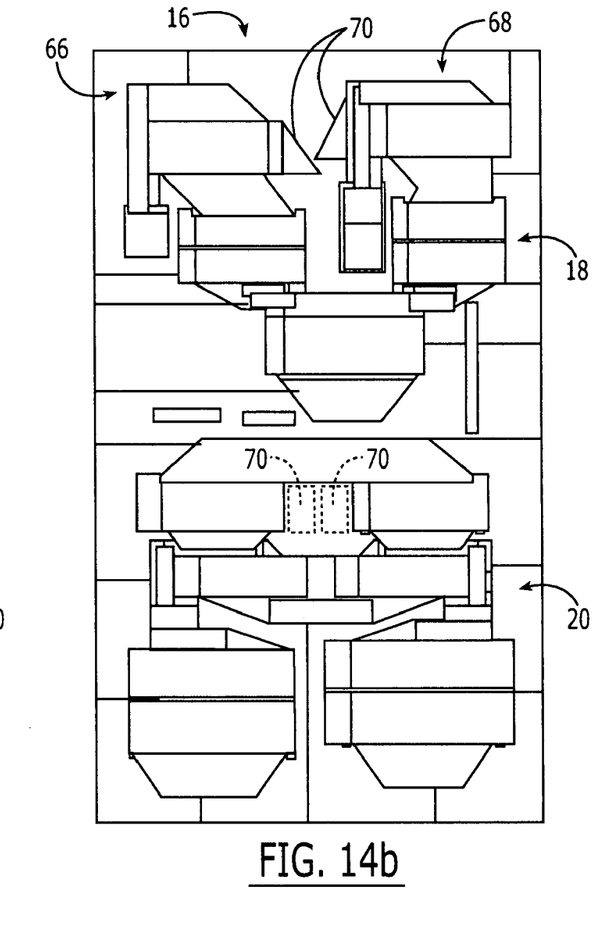

To further illustrate, and with reference to FIG. 12, a SAW duplexer die 64 is illustrated without a ground insert between the input SAW resonator 66 and the output resonator 68 of the transmitted filter 20. The isolation performance of the duplexer is illustrated with reference to FIG. 13 including a supposition of six different frequency responses for the same type of duplexer 64. As can be seen, there exists a clear resonance at the transmitted band that results from a coupling between the resonators 66, 68. As illustrated with reference to FIGS. 14a and 14b, a metal wedge or insert 70 in the shape of a triangle, diamond, quadrilateral, circle, arcuate shape, or polygon is inserted to refract waves as shown in FIG. 14 of the present invention. As will come to the mind of one skilled in the art, the metal insert may comprise a shape selected from at least one of a diamond, a quadrilateral, a polygon, a triangle, a circle, and an arcuate form, and may be inserted as herein described within the received SAW filter, transmitted SAW filter, or both.

Figure 15:
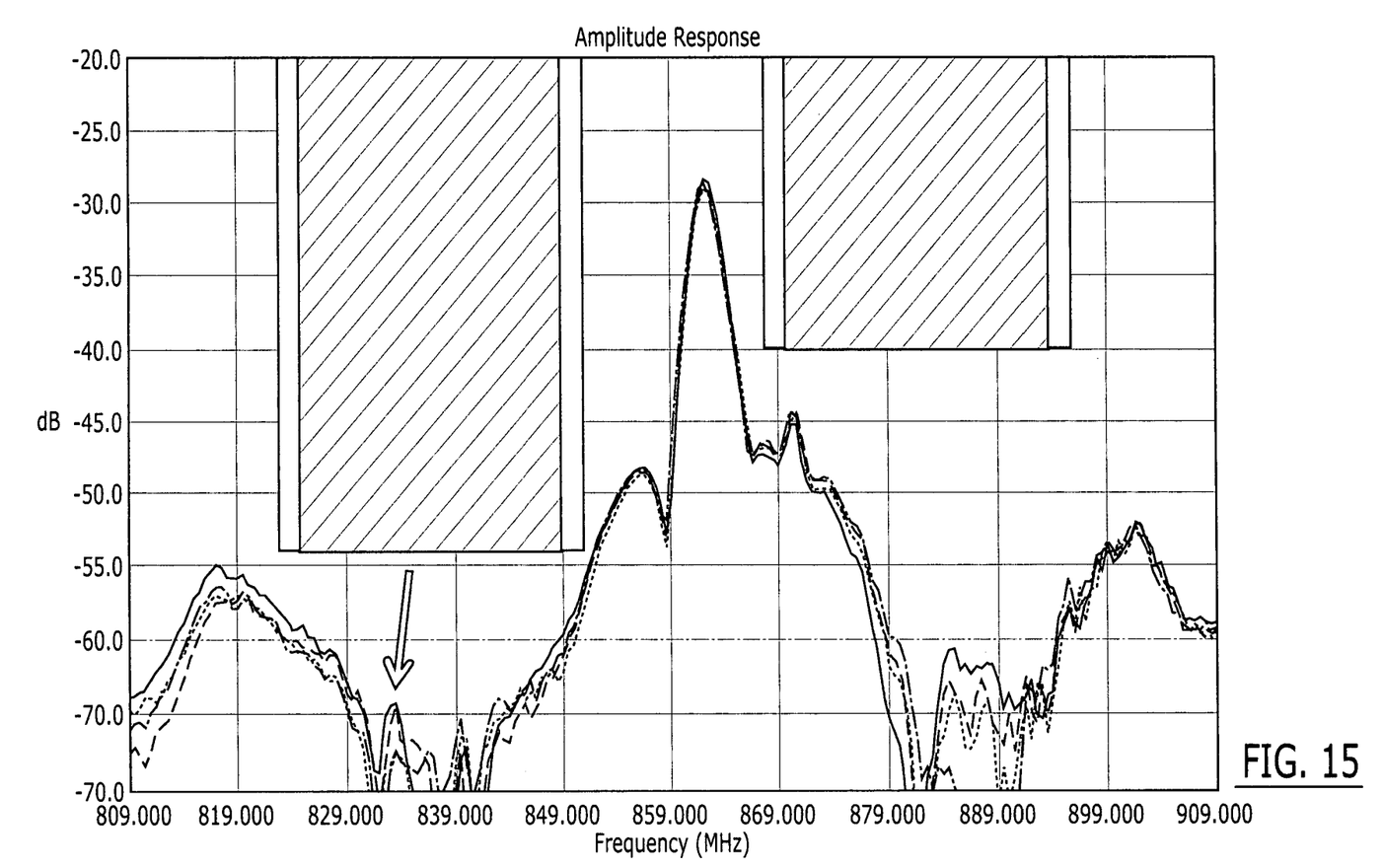
FIG. 15 illustrates a frequency response for the SAW duplexer herein described, by way of example, illustrating an improved isolation performance resulting from the use of the metal inserts positioned between the first and second resonators.

The insert 70, as herein described, disproportionally perturbs the propagation of the waves and thereby eliminates resonance. By way of example, the metal wedge may be made of Al or Al alloy and may generally be of the same metal thickness as that of the duplexer filter pattern. The isolation performance of the SAW duplexer 10, herein described by way of example for an embodiment of the present invention, including the insert 70, as metal wedges inserted between the resonators 66, 68, is illustrated with reference to the response curves of FIG. 15. As can be seen, the resonance structure at the transmitted band is clearly suppressed.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A duplexer comprising:
   a multi-layered package;
   a piezoelectric crystal chip carried within the package;
   first and second SAW filters carried on the piezoelectric crystal chip, the first and second SAW filters having different passband frequencies, wherein the first SAW filter forms a received filter and the second SAW filter forms a transmitted filter, and wherein the first and second SAW filters are mounted within the multi-layer package;
   a phase matching stripline embedded generally diagonally within the multi-layered package between two ground layers carried therein; and
   at least two rows of vias positioned on opposing sides of the stripline for providing ground shielding so as to reduce coupling between the two SAW filters.

2. A duplexer as recited in claim 1, wherein the phase matching stripline is positioned to form an angle having a value ranging from approximately 30° to approximately 60° with respect to a side of the package.

3. A duplexer as recited in claim 2, wherein the stripline comprises a serpentine styled structure.

4. A duplexer comprising:
   a package;
   a piezoelectric crystal chip carried within the package;
   first and second SAW filters carried on the piezoelectric crystal chip, the first and second SAW filters having different passband frequencies, wherein the first SAW filter forms a received filter and the second SAW filter forms a transmitted filter;
   a phase matching stripline positioned between two ground layers carried within the package, wherein the phase matching stripline is diagonally positioned with respect to a side of the package; and
   a plurality of vias arranged on opposing sides of the stripline for providing ground shielding, thus reducing coupling between the first and second SAW filters.

5. A duplexer as recited in claim 4, wherein the phase matching stripline is formed as a serpentine structure.

6. A duplexer as recited in claim 4, wherein at least one of the first and second SAW filters comprises resonators, and wherein the duplexer comprises a metal insert positioned between the resonators of the at least one of the first and second filters so as to reduce a coupling between the resonators and for enhancing an isolation performance of the duplexer.

7. A duplexer as recited in claim 6, wherein the metal insert comprises a shape selected from at least one of a diamond, a quadrilateral, a polygon, a triangle, a circle, and an arcuate form.

8. A duplexer as recited in claim 6, wherein the metal insert is formed from a material selected from Al, Al alloy, and a material that forms electrodes of the resonators.

9. A duplexer as recited in claim 4, further comprising a ground metal pad located between the first SAW filter and the second SAW filter for reducing a coupling therebetween and enhancing isolation performance of the duplexer.

10. A duplexer as recited in claim 9, wherein the ground metal pad is formed from a material selected from Al, Al alloy, and a material that forms electrodes of the resonators.

* * * * *